United States Patent
Liu et al.

(10) Patent No.: US 10,262,878 B2
(45) Date of Patent: Apr. 16, 2019

(54) FLUORINE CONTAMINATION CONTROL IN SEMICONDUCTOR MANUFACTURING PROCESS

(71) Applicant: Taiwan Semiconductor Manufacturing Co., Ltd., Hsinchu (TW)

(72) Inventors: Li-Jung Liu, Hsinchu (TW); Chih-Pin Tsao, Hsinchu (TW); Chia-Wei Soong, Taoyuan (TW); Jyh-Huei Chen, Hsinchu (TW); Shu-Hui Wang, Hsinchu (TW); Shih-Hsun Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/155,186

(22) Filed: Oct. 9, 2018

(65) Prior Publication Data
US 2019/0051542 A1 Feb. 14, 2019

Related U.S. Application Data

(62) Division of application No. 15/609,199, filed on May 31, 2017, now Pat. No. 10,109,507.
(Continued)

(51) Int. Cl.
*H01L 27/088* (2006.01)
*H01L 21/67* (2006.01)
(Continued)

(52) U.S. Cl.
CPC ........ *H01L 21/67069* (2013.01); *H01J 37/32* (2013.01); *H01L 21/0274* (2013.01);
(Continued)

(58) Field of Classification Search
CPC ............ H01L 27/0886; H01L 27/0924; H01L 27/10826; H01L 27/10879; H01L 27/1211
See application file for complete search history.

(56) References Cited

U.S. PATENT DOCUMENTS 9,882,051 B1 * 1/2018 Roh ................. H01L 29/41791
2017/0110375 A1 4/2017 Bao et al.

* cited by examiner

*Primary Examiner* — Hoai V Pham
(74) *Attorney, Agent, or Firm* — Sterne, Kessler, Goldstein & Fox P.L.L.C.

(57) ABSTRACT

A method of forming a semiconductor device includes forming a fin over a substrate, forming a polysilicon gate structure over the fin, and replacing the polysilicon gate structure with a metal gate structure. Replacing of the polysilicon gate structure includes depositing a work function metal layer over the fin, performing a sublimation process on a non-fluorine based metal precursor to produce a gaseous non-fluorine based metal precursor, and depositing a substantially fluorine-free metal layer over the work function metal layer based on the gaseous non-fluorine based metal precursor. The substantially fluorine-free metal layer includes an amount of fluorine less than about 5 atomic percent. An example benefit includes reduction or elimination of diffusion of fluorine contaminants from a gate metal fill layer into its underlying layers and from conductive layers into diffusion barrier layers and silicide layers of source/drain contact structures and consequently, the reduction of the negative impact of these fluorine contaminants on device performance.

20 Claims, 10 Drawing Sheets

Related U.S. Application Data

(60) Provisional application No. 62/344,090, filed on Jun. 1, 2016.

(51) Int. Cl.

| | | |
|---|---|---|
| *H01L 29/78* | (2006.01) | |
| *H01L 23/485* | (2006.01) | |
| *H01L 21/311* | (2006.01) | |
| *H01L 21/3065* | (2006.01) | |
| *H01L 21/027* | (2006.01) | |
| *H01J 37/32* | (2006.01) | |

(52) U.S. Cl.
CPC .... *H01L 21/3065* (2013.01); *H01L 21/31116* (2013.01); *H01L 21/31144* (2013.01); *H01L 21/67063* (2013.01); *H01L 23/485* (2013.01); *H01L 29/7851* (2013.01); *H01L 2924/12042* (2013.01)

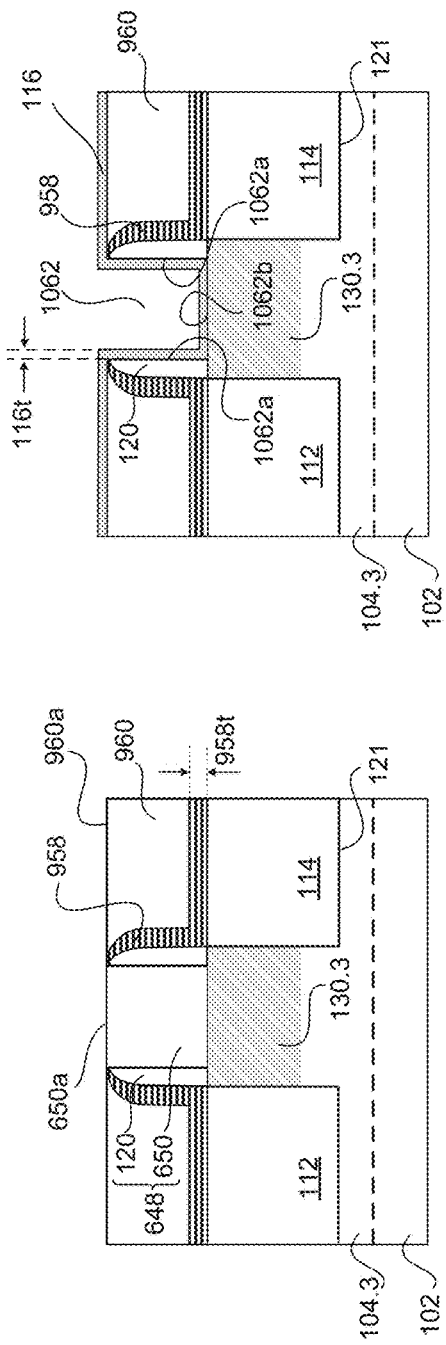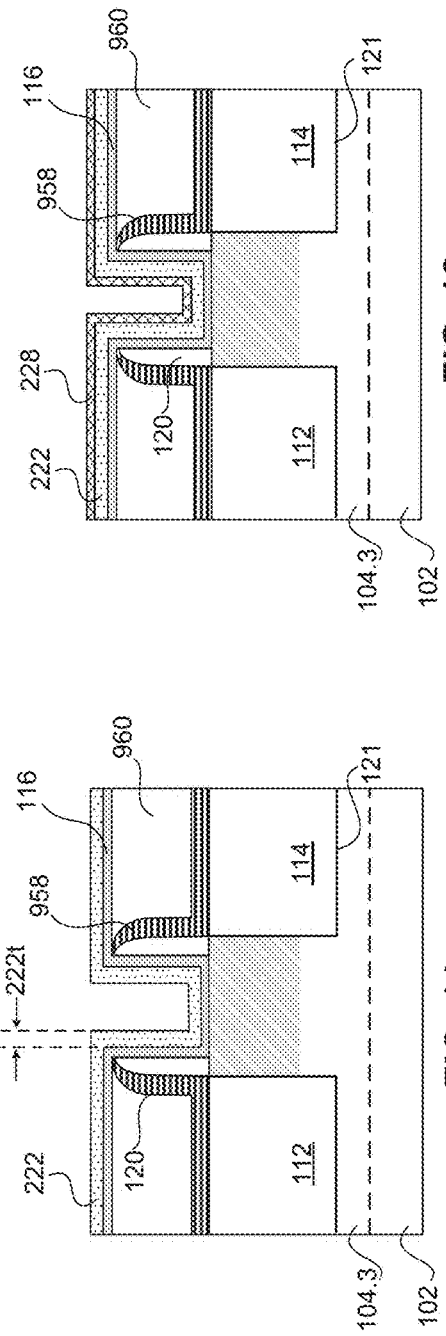

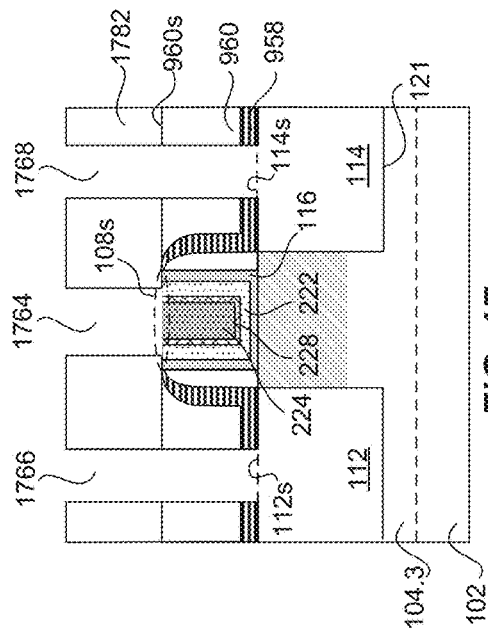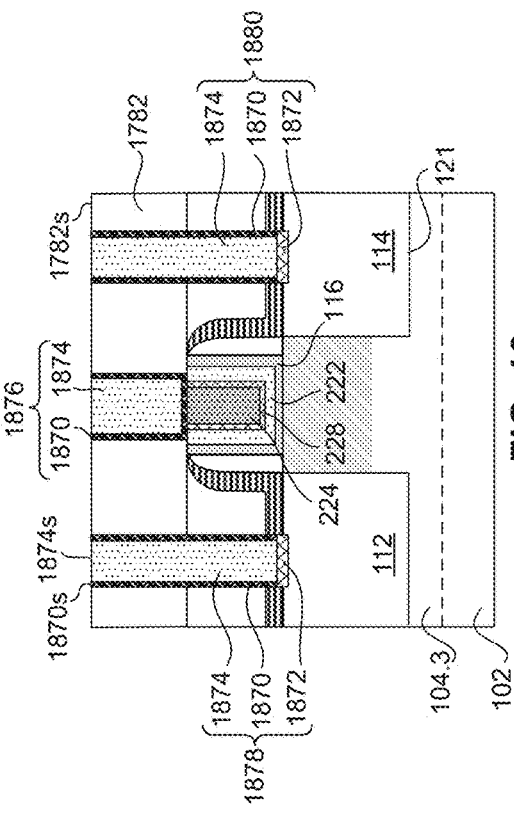

US 10,262,878 B2

FLUORINE CONTAMINATION CONTROL IN SEMICONDUCTOR MANUFACTURING PROCESS

CROSS-REFERENCE TO RELATED APPLICATION

This application is a divisional of U.S. Provisional patent application Ser. No. 15/609,199, titled "Fluorine Contamination Control in Semiconductor Manufacturing Process," which was filed on May 31, 2017 and is incorporated herein by reference in its entirety.

BACKGROUND

This disclosure generally relates to semiconductor devices and methods of fabricating the same.

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and finFETs.

Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 9-18 are cross-sectional views of a finFET at various stages of its fabrication process, according to some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
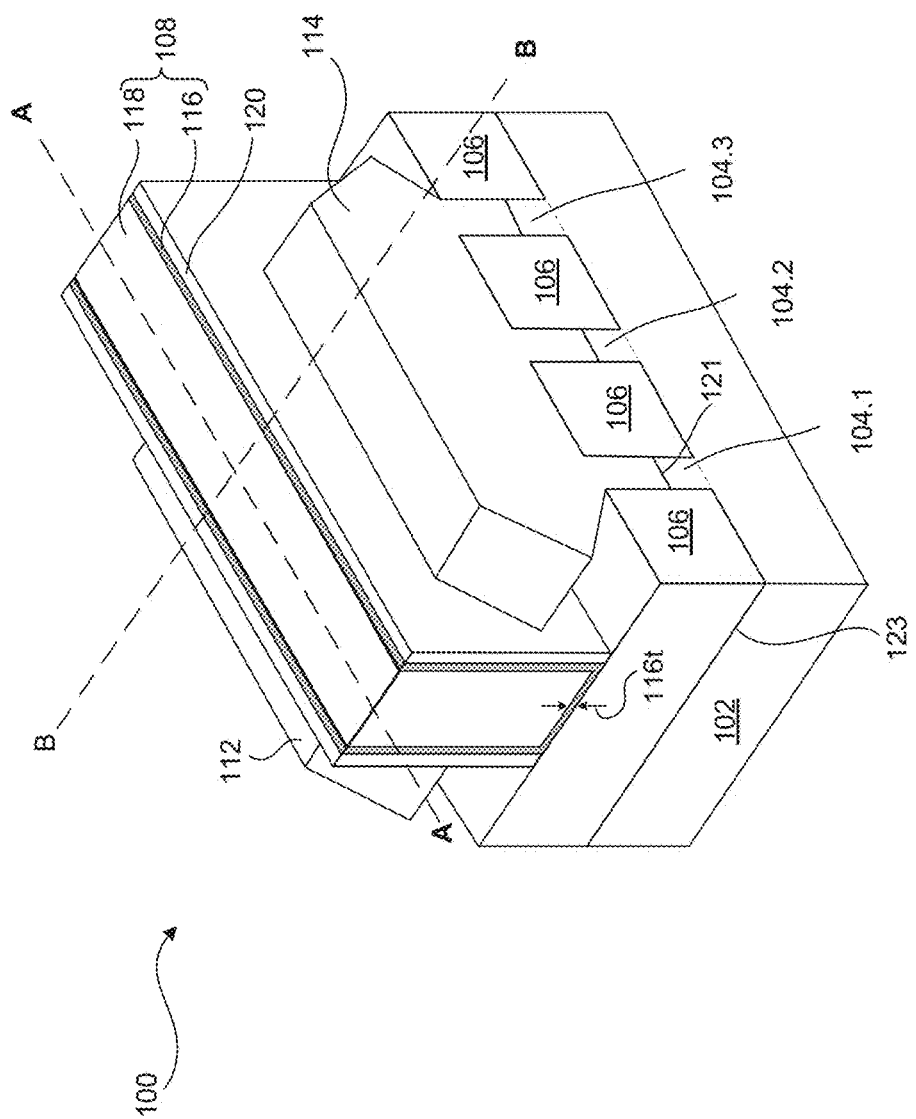
FIG. 1 is an isometric view of a finFET, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition is for the purpose of simplicity and clarity and does not in itself dictate a relationship between the embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

The term "about" as used herein indicates the value of a given quantity varies by ±10% of the value, or optionally ±5% of the value, or in some embodiments, by ±1% of the value so described. For example, "about 100 nm" encompasses a range from 90 nm to 110 nm, inclusive.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "selectivity" refers to the ratio of the etch rates of two materials under the same etching conditions.

As used herein, the term "substrate" describes a material onto which subsequent material layers are added. The substrate itself may be patterned, and materials added on top of it may also be patterned, or may remain without patterning. Furthermore, "substrate" may be any of a wide array of semiconductor materials such as silicon, germanium, gallium arsenide, indium phosphide, etc. Alternatively, the substrate may be electrically non-conductive such as a glass or sapphire wafer.

As used herein, the term "high-k" refers to a high dielectric constant. In the field of semiconductor device structures and manufacturing processes, high-k refers to a dielectric constant that is greater than the dielectric constant of $SiO_2$ (i.e., greater than 3.9).

As used herein, the term "vertical" means nominally perpendicular to the surface of a substrate.

Overview

Embodiments in accordance with this disclosure provide methods for forming substantially fluorine-free metal gate structures and contact structures in finFET devices. The term "substantially fluorine free," as used herein, means that there is less than about 5 atomic percent fluorine.

An Exemplary FinFET

FIG. 1 is an isometric view of an exemplary finFET 100 taken after a gate replacement process, according to some embodiments. FinFET 100 may be included in a microprocessor, memory cell, or other integrated circuit (IC). Although FIG. 1 illustrates finFET 100, it is understood the IC may include any number of other devices including resistors, capacitors, inductors, fuses, etc. FIG. 1 is for illustrative purposes and is not drawn to scale.

FinFET 100 is formed on a substrate 102, and includes a plurality of fins 104.1 through 104.3, a plurality of shallow trench isolation (STI) regions 106, a gate structure 108 disposed on each of the fins 104.1 through 104.3, spacers 120, a source/drain region 112 disposed on one side of gate structure 108, and a drain/source region 114 disposed on another side of gate structure 108. The names "source" and "drain" can be interchangeable based on the voltage that is applied to those terminals when the transistor is operated. FIG. 1 shows one gate structure 108. However, there may be additional gate structure(s) (not shown) similar and parallel to gate structure 108. In addition, finFET 100 may be incorporated into an integrated circuit through the use of other structural components such as source/drain contacts, gate contacts, vias, interconnect metal layers, dielectric layers, passivation layers, etc., that are omitted for the sake of clarity. The isometric view of FIG. 1 is taken after formation of gate structure 108 in a gate replacement process.

Substrate 102 represents a physical material on which finFET 100 is formed. Substrate 102 is a semiconductor material such as, but not limited to, silicon. In some embodiments, substrate 102 includes a crystalline silicon substrate (e.g., wafer). In some embodiments, substrate 102 includes another elementary semiconductor, such as germanium; a compound semiconductor including silicon carbide, gallium arsenic, gallium phosphide, indium phosphide, indium arsenide, indium antimonide; an alloy semiconductor including silicon germanium carbide, silicon germanium, gallium arsenic phosphide, gallium indium phosphide, gallium indium arsenide, gallium indium arsenic phosphide, aluminum indium arsenide, aluminum gallium arsenide; or combinations thereof. Yet in some embodiments, substrate 102 includes an epitaxial layer (epi-layer), may be strained for performance enhancement, and/or includes a silicon-on-insulator (SOI) structure. Further, substrate 102 may be doped depending on design requirements (e.g., p-type substrate or n-type substrate). In some embodiments, the substrate 102 may be doped with p-type dopants, such as boron or n-type dopants, such as phosphorus or arsenic. The doped substrate 102 may be configured for an n-type finFET, or alternatively configured for a p-type finFET.

Fins 104.1 through 104.3 represent current carrying structures of finFET 100. Fins 104.1, 104.2, and 104.3 include channel regions (not shown in FIG. 1; a cross-sectional view of channel region 130.3 corresponding to fin 104.3 is shown in FIG. 9). Each of the channel regions underlies gate structure 108 and is disposed between source/drain regions 112 and 114. Channel regions provide conductive paths between source/drain regions 112 and 114 when a voltage applied to gate structure 108 turns on finFET 100. It should be noted that even though finFET 100 is shown in FIG. 1 as including three fins 104.1 through 104.3, finFET 100 may include any suitable number of fins as would be understood by a person of skill in the art(s). This suitable number can include a single fin as well as multiple fins similar to those illustrated in FIG. 1.

STI regions 106 provide electrical isolation of finFET 100 from neighboring active and passive elements (not illustrated in FIG. 1) integrated with or deposited onto substrate 102. STI regions 106 are made of dielectric material. In some embodiments, STI regions 106 include silicon oxide, silicon nitride, silicon oxynitride, fluorine-doped silicate glass (FSG), a low-k dielectric material, and/or other suitable insulating material. In some embodiments, STI regions 106 include a multi-layer structure, for example, having one or more liner layers disposed on substrate 102.

FinFET 100 further includes an interface 121 between fins 104.1 through 104.3 and source/drain regions 112 and 114 and an interface 123 between STI regions 106 and substrate 102. In some embodiments, interface 121 is coplanar with interface 123. In some embodiments, interface 121 is either above or below the level of interface 123. In some embodiments, interface 121 is above the level of the top surface of STI regions 106.

Source/drain regions 112 and 114 are formed on fins 104.1 through 104.3. Source/drain regions 112 and 114 include epitaxially-grown semiconductor material on recessed portions of fins 104.1 through 104.3 on either side of gate structure 108. In some embodiments, the epitaxially grown semiconductor material is the same material as the material of substrate 102. In some embodiments, the epitaxially-grown semiconductor material is a strained semiconductor material that includes a different material from the material of substrate 102 and imparts a strain on the channel. Since the lattice constant of the strained semiconductor material is different from the material of substrate 102, channel regions are strained to advantageously increase carrier mobility in the channel region of finFET 100 and thereby enhance its performance. The epitaxially-grown semiconductor material may include elementary semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), or gallium arsenide phosphide (GaAsP).

Further, source/drain regions 112 and 114 may be in-situ doped during the epi process. In some embodiments, the epitaxially-grown source/drain regions 112 and 114 may be doped with p-type dopants, such as boron or $BF_2$; n-type dopants, such as phosphorus or arsenic; and/or combinations thereof; epitaxially grown strained SiGe source/drain regions 112 and 114 may be doped with p-type dopants, such as boron or $BF_2$, n-type dopants, such as phosphorus or arsenic, and/or combinations thereof; epitaxially grown Si source/drain regions 112 and 114 may be doped with carbon to form Si:C source/drain regions 112 and 114, phosphorous to form Si:P source/drain regions 112 and 114, or both carbon and phosphorous to form SiCP source/drain regions 112 and 114. In some embodiments, source/drain regions 112 and 114 are not in-situ doped, and an implantation process (e.g., a junction implant process) is performed to dope source/drain regions 112 and 114.

Gate structure 108 traverses each of fins 104.1 through 104.3 and wraps around a portion of each of the fins 104.1 through 104.3 defining the channel regions underlying gate structure 108 and between source/drain regions 112 and 114. Gate structure 108 controls the current flowing between source/drain regions 112 and 114 through the channel regions. Gate structure 108 includes a dielectric layer 116 and a gate electrode 118. In some embodiments, dielectric layer 116 is adjacent to and in contact with gate electrode 118. In some embodiments, a thickness 116t of dielectric layer 116 is in the range of about 1 nm to about 5 nm. Gate structure 108 may further include interfacial layers at interface between gate structure 108 and fins 104.1 through 104.3, capping layers, etch stop layers, and/or other suitable materials in some embodiments. The interfacial layers may include a dielectric material such as a silicon dioxide layer ($SiO_2$) or silicon oxynitride (SiON) and help to reduce damage between gate structure 108 and fins 104.1 through 104.3. The interfacial dielectric layers may be formed by chemical oxidation, thermal oxidation, atomic layer deposition (ALD), chemical vapor deposition (CVD), and/or other suitable formation processes.

Figure 2A:
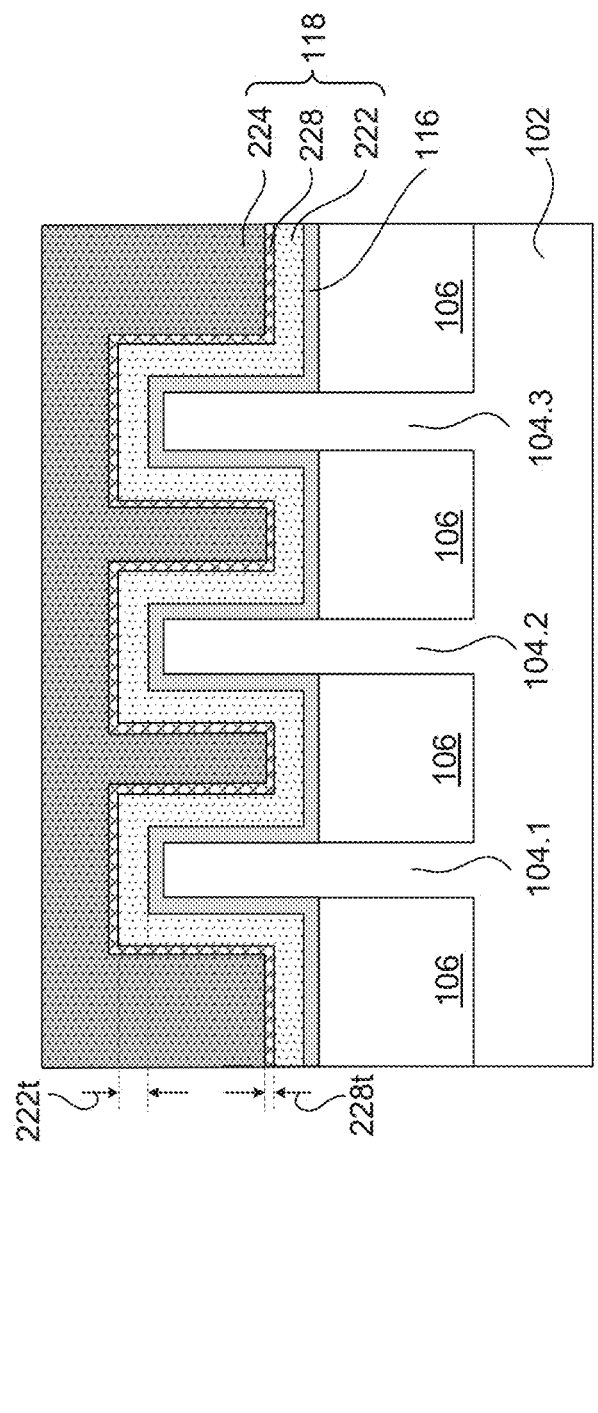
FIG. 2A is a cross-sectional view of a finFET, according to some embodiments.

Dielectric layer 116 traverses each of fins 104.1 through 104.3 and wraps around a portion of each of fins 104.1 through 104.3 as illustrated in FIG. 2A. FIG. 2A is a cross-sectional view of finFET 100 along line A-A in FIG. 1. Dielectric layer 116 may include silicon oxide formed by CVD, ALD, physical vapor deposition (PVD), e-beam evaporation, or other suitable process. In some embodiments, dielectric layer 116 includes one or more layers of silicon oxide, silicon nitride, silicon oxynitride, or high-k dielectric materials such as hafnium oxide ($HfO_2$), $TiO_2$, HfZrO, $Ta_2O_5$, $HfSiO_4$, $ZrO_2$, $ZrSiO_2$, or combinations thereof. Alternatively, high-k dielectric materials may include metal oxides. Examples of metal oxides used for high-k dielectrics include oxides of Li, Be, Mg, Ca, Sr, Sc, Y, Zr, Al, La, Ce, Pr, Nd, Sm, Eu, Gd, Tb, Dy, Ho, Er, Tm, Yb, Lu, and/or mixtures thereof. The high-k dielectric layer may be formed by ALD and/or other suitable methods. In some embodiments, dielectric layer 116 includes a single layer or a stack of insulating material layers. Spacers 120 are in substantial contact with dielectric layer 116.

Referring back to FIG. 2A, gate electrode 118 may include a gate work function metal layer 222 and a gate metal fill layer 224. The cross-sectional view of finFET 100 in FIG. 2A is taken after the formation of dielectric layer 116 and gate electrode 118 in a gate replacement process. It should be noted that the exemplary illustration of finFET 100 in FIG. 1 and the exemplary illustration of finFET 100 along line A-A in FIG. 2A may not be to scale. FIG. 2A is intended to describe additional structures of finFET 100 as well as further describe those structures of finFET 100 that are illustrated in FIG. 1. FinFET 100 need not include all of the additional structures of finFET 100 as illustrated in FIG. 2 without departing from the spirit and scope of this disclosure. Rather, different structures, configurations, and arrangements, as well as different configurations and arrangements for the structures described in FIGS. 1 and 2 are possible for finFET 100.

In some embodiments, gate work function metal layer 222 is disposed on dielectric layer 116. Gate work function metal layer 222 may include a single metal layer or a stack of metal layers. The stack of metal layers may include metals having work functions similar to or different from each other. In some embodiments, gate work function metal layer 222 includes any suitable material, such as aluminum (Al), copper (Cu), tungsten (W), titanium (Ti), tantulum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. Exemplary work function metal(s) that may be included in gate work function metal 222 in a p-type device include TiN, TaN, Ru, Mo, Al, WN, $ZrSi_2$, $MoSi_2$, $TaSi_2$, $NiSi_2$, WN, other suitable p-type work function metals, or combinations thereof. Exemplary work function metal(s) that may be included in work function metal layer 222 in an n-type device include Ti, Ag, TaAl, TaAlC, TiAlN, TaC, TaCN, TaSiN, Mn, Zr, other suitable n-type work function materials, or combinations thereof. Gate work function metal layer 222 may be formed using a suitable process such as ALD, CVD, PVD, plating, or combinations thereof. In some embodiments, a thickness 222t of gate work function metal layer 222 is in the range of about 2 nm to about 15 nm.

Gate work function metal layer 222 is one of the factors that helps to control and tune threshold value for current flow between source/drain regions 112 and 114. A work function value is associated with the composition of the one or more metals included in gate work function metal layer 222. The one or more metals are chosen to set the work function of gate work function metal layer 222 so that a desired threshold voltage is achieved. In some embodiments, the work function of the one or more metals is in the range of about 4 eV to about 6 eV.

Gate metal fill layer 224 may include a single metal layer or a stack of metal layers. The stack of metal layers may include metals different from each other. In some embodiments, gate metal fill layer 224 includes any suitable conductive material, such as Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. Gate metal fill layer 224 may be formed by ALD, PVD, CVD, or other suitable conductive material deposition process. In some embodiments, gate metal fill layer 224 includes a substantially fluorine-free (FF) metal film or a FF metal-containing film either of which may be formed by ALD or CVD using one or more non-fluorine based metal precursors. The substantially FF metal film or FF metal-containing film may include an amount of fluorine contaminants less than 5 atomic percent in the form of ions and/or atoms. The fluorine contaminants may be from other process variables (e.g., etching process) and not from the deposition process of the substantially FF metal film or FF metal-containing film. In some embodiments, the substantially FF metal film or FF metal-containing film may include an amount of non-fluorine contaminants or non-fluorine halogen contaminants greater than 3 atomic percent (e.g., about 5 atomic percent, about 7 atomic percent, about 10 atomic percent) in the form of ions and/or atoms. In some embodiments, gate metal fill layer 224 includes substantially fluorine-free tungsten (FFW) film or FFW-containing film having an amount of fluorine contaminants less than 5 atomic percent and an amount of chlorine contaminants greater than 3 atomic percent (e.g., about 5 atomic percent, about 7 atomic percent, about 10 atomic percent). The FFW film or the FFW-containing film may be formed by ALD or CVD using one or more non-fluorine based W precursors such as, but not limited to, tungsten pentachloride ($WCl_5$), tungsten hexachloride ($WCl_6$).

Gate metal fill layer in gate electrodes of semiconductor devices can include a W film or a W-containing film that is made using one or more fluorine-based W precursors (e.g., tungsten hexafluoride ($WF_6$)). The gate metal fill layer in current gate electrodes can have an amount of fluorine contaminants greater than 10 atomic percent (e.g., 15 atomic percent, 20 atomic percent). The current devices generally suffer from poor device performance due to diffusion of fluorine from the W film or the W-containing film into one or more underlying layers such as gate work function metal layers (e.g., gate work function metal layer 222), dielectric layers (e.g., dielectric layer 116), fins (e.g., fins 104.1 through 104.3), and/or other layers and/or structures of the current devices. The presence of such fluorine contaminants in considerable amount, that is greater than 5 atomic percent fluorine in the W film or the W-containing film, adversely affects the chemical and physical properties of the underlying material layers of the current devices. For example, diffusion of fluorine contaminants into underlying gate work function metal layers can negatively affect the work function of the one or more metals included in the gate work function metal layers, and consequently, have a negative effect on the threshold voltage.

Threshold voltage non-uniformity in the current devices is another negative effect of fluorine diffusion from the W film or the W-containing film into the underlying layers and/or structures of the current devices. Threshold voltage non-uniformity can result in poor control of current/voltage operation, poor load balancing at turn-on, and consequently, poor performance of the current devices. This non-uniformity in threshold voltage is due to non-uniform diffusion of fluorine from the W film or the W-containing film into the one or more underlying layers and/or structures. The amount of fluorine diffused into a portion of the underlying layer and/or structure may depend on a thickness of a portion of gate metal fill layer disposed over the portion of the underlying layer and/or structure. Different portions of gate metal fill layer having different thicknesses may have different amounts of fluorine contaminants. Thus, different amounts of fluorine contaminants may diffuse into different portions of the underlying layers and/or substrate. The different thicknesses of the different portions of gate metal fill layer may be a design choice for achieving a predetermined device performance and/or may be due to limitations in, for example, photolithographic process, etching process, other device fabrication processes, or a combination thereof.

Figure 2B:
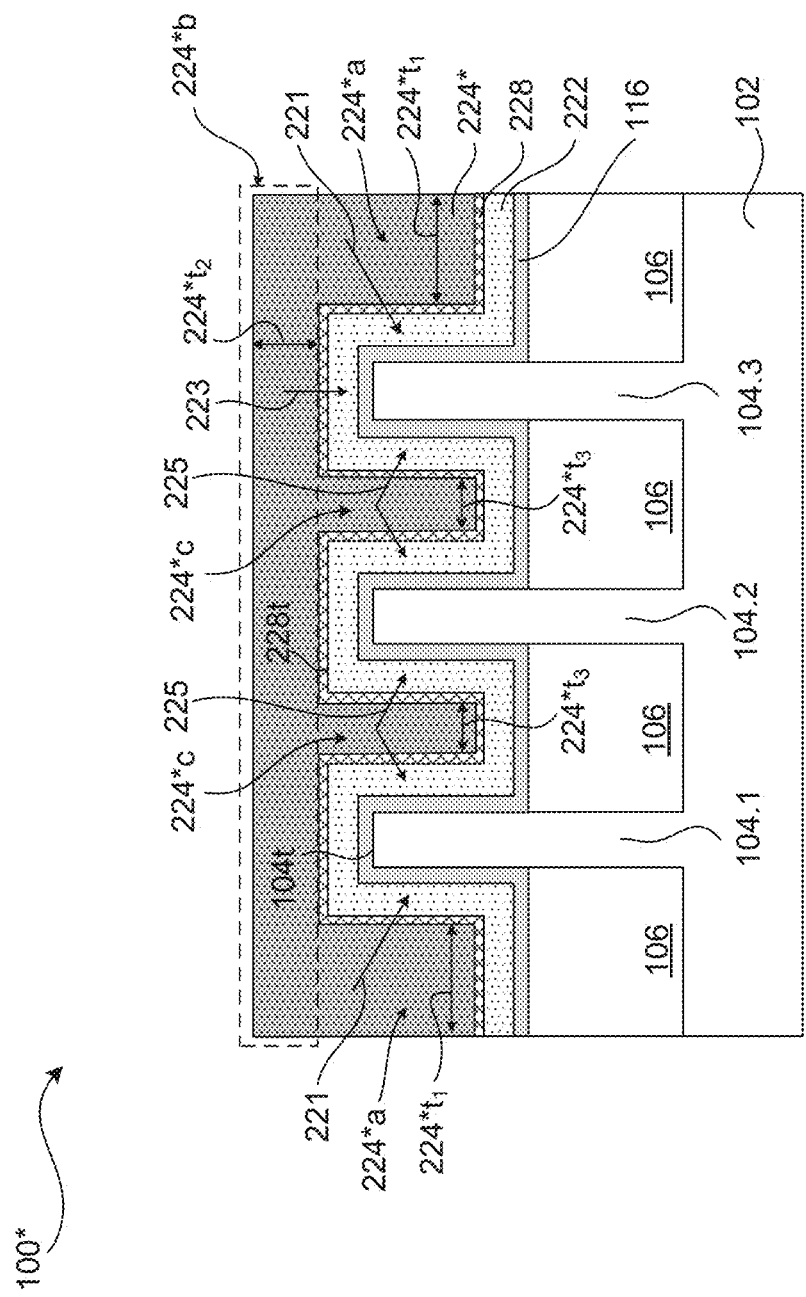
FIG. 2B is a cross-sectional view of a finFET.

FIG. 2B illustrates an example of non-uniform diffusion of fluorine contaminants from a W film included in a gate metal fill layer 224* of a finFET 100*. Cross-sectional view of finFET 100* may be similar to finFET 100 as shown in FIG. 2A, but, unlike finFET 100, gate metal fill layer 224* includes a fluorine contaminated W film. The fluorine contaminants can be from a fluorine based precursor used in the formation of gate metal fill layer 224*. Arrows 221, 223, and 225 in FIG. 2B represent fluorine diffusion from gate metal fill layer portions 224*a, 224*b, and 224*c, respectively, into underlying layers and/or structures such as gate work function metal layer 222, dielectric layer 116, and/or fins 104.1 through 104.3. Thickness 224*$t_1$, 224*$t_2$, and 224*$t_3$ of gate metal fill layer portions 224*a, 224*b, and 224*c, respectively, vary with respect to each other due to process limitations (e.g., photolithographic process, etching process) and/or by design choice such that thickness 224*$t_1$>thickness 224*$t_2$>thickness 224*$t_3$. As a result of such thickness variation, different amounts of fluorine are diffused from gate metal fill layer portions 224*a, 224*b, and 224*c into corresponding underlying portions of gate work function metal layer 222, dielectric layer 116, and/or fins 104.1 through 104.3. For example, due to thickness 224*$t_1$>thickness 224*$t_2$>thickness 224*$t_3$, amounts of fluorine diffused from portion 224*a into portions of gate work function metal layer 222, dielectric layer 116, and/or fins 104.1 through 104.3 that are closer to portion 224*a are greater than amounts of fluorine diffused from portions 224*b and 224*c into portions of gate work function metal layer 222, dielectric layer 116, and/or fins 104.1 through 104.3 that are closer to portions 224*b and 224*c. The different amounts of diffused fluorine in different portions of gate work function metal layer 222, dielectric layer 116, and/or fins 104.1 through 104.3 create a non-uniform distribution of threshold voltage in finFET 100*.

In order to prevent and/or reduce the negative effects of diffusion of unwanted fluorine from gate metal fill layers into underlying layer(s) and/or structure(s) of the current devices, the present disclosure describes FF gate metal fill layers such as gate metal fill layer 224. In some embodiments, threshold voltage non-uniformity is reduced by about 20% in devices (e.g., finFET 100) having FF gate metal fill layers (e.g., gate metal fill layer 224) compared to threshold voltage non-uniformity in devices (e.g., finFET 100*) having fluorine contaminated W film or W-containing film that is made using one or more fluorine based W precursors. It should be noted that threshold voltage non-uniformity may be present in devices (e.g., finFET 100) having FF gate metal fill layers (e.g., gate metal fill layer 224) due to other process variables, for example channel doping, gate dielectric thickness, interfacial effects, as well as many other variables. It should also be noted that even though FF gate metal fill layer 224 is described herein with reference to finFET 100, a person skilled in the art would understand that such FF gate metal fill layer 224 may be included in gate electrodes of other types of FETs such as, but not limited to metal oxide semiconductor FET (MOSFET).

Referring back to FIG. 2A, additionally or optionally, gate electrode 118 includes a gate metal liner 228 disposed on gate work function metal layer 222 in some embodiments. Gate metal liner 228 may serve as a nucleation layer, which acts as a growth site for subsequent formation of gate metal fill layer 224. Gate metal liner 228 may include any suitable metal such as W, Al, Co, Ti, Ag, Mn, Zr, Cu, Ni, and/or combinations thereof and may be formed by ALD, PVD, CVD, or other suitable metal deposition process. In some embodiments, gate metal liner 228 includes substantially FF metal film and may be formed by ALD or CVD using one or more non-fluorine based precursors. In some embodiments, gate metal fill layer 224 includes substantially FFW material. In some embodiments, gate metal liner 228 has a thickness 228$t$ less than 10 nm.

An Example Method for Fabricating a FinFET

FIGS. 3-8 are isometric views of finFET 100 (as illustrated in FIGS. 1 and 2A) at various stages of its exemplary fabrication. FIGS. 9-18 are cross-sectional views along line B-B of finFET 100 of FIG. 1 at various stages of its exemplary fabrication.

Figure 3:
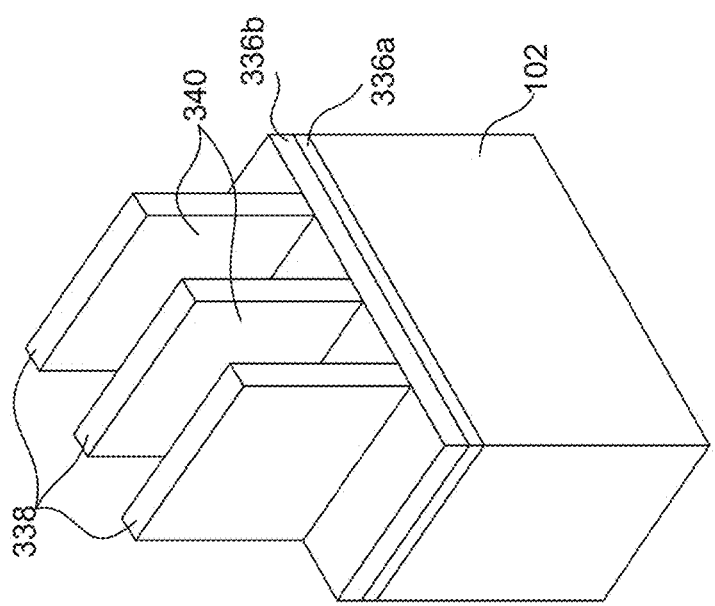

FIG. 3 is an isometric view of a partially fabricated finFET 100 after patterning of photoresist on substrate 102 for formation of fins 104.1 through 104.3. Fins 104.1 through 104.3 are formed by etching into substrate 102. A pad layer 336a and a mask layer 336b are formed on substrate 102. Pad layer 336a may be a thin film including silicon oxide formed, for example, using a thermal oxidation process. Pad layer 336a may act as an adhesion layer between substrate 102 and mask layer 336b. Pad layer 336a may also act as an etch stop layer for etching mask layer 336b. In some embodiments, mask layer 336b is formed of silicon nitride, for example, using low pressure chemical vapor deposition (LPCVD) or plasma enhanced CVD (PECVD). Mask layer 336b is used as a hard mask during subsequent photolithography processes. A photoresist layer 338 is formed on mask layer 336b and is then patterned, forming openings 340 in photo-sensitive layer 338.

Figure 4:
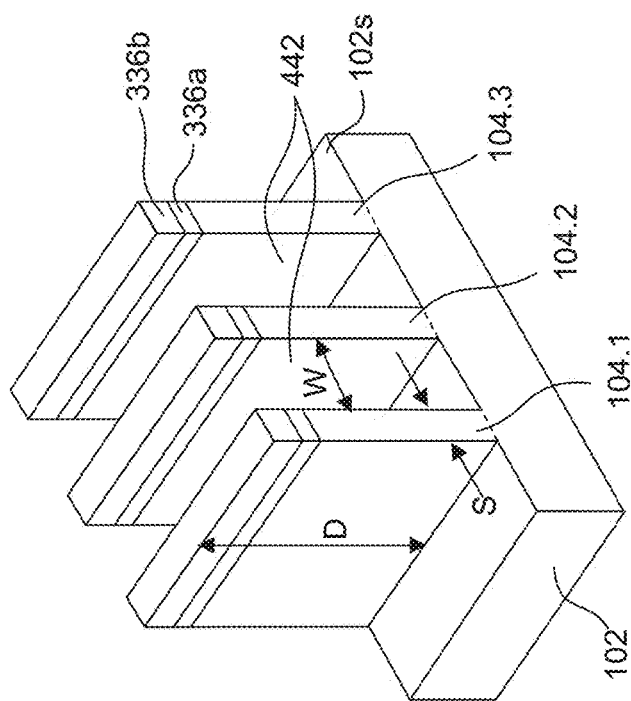
FIGS. 3-8 are isometric views of a finFET at various stages of its fabrication process, according to some embodiments.

FIG. 4 is an isometric view of a partially fabricated finFET 100 after the exemplary formation of fins 104.1 through 104.3. Hard mask layer 336b and pad layer 336a are etched through openings 340 to expose underlying substrate 102. The exposed substrate 102 is then etched to form trenches 442 with top surfaces 102s of substrate 102. Portions of substrate 102 between trenches 442 form fins 104.1 through 104.3. Patterned photoresist 338 is then removed. Next, a cleaning may be performed to remove a native oxide of substrate 102. The cleaning may be performed using diluted hydrofluoric (DHF) acid. In some embodiments, trenches 442 are spaced apart from adjacent trenches by a spacing S (i.e., fin widths) smaller than about 30 nm and depth D of trenches 442 ranges from about 210 nm to about 250 nm while width W (i.e., fin spacing) of trenches 442 is less than 50 nm. In some embodiments, the aspect ratio (D/W) of trenches 442 is greater than about 7.0. In some embodiments, the aspect ratio may even be greater than about 8.0. In some embodiments, the aspect ratio is lower than about 7.0.

Figure 5:
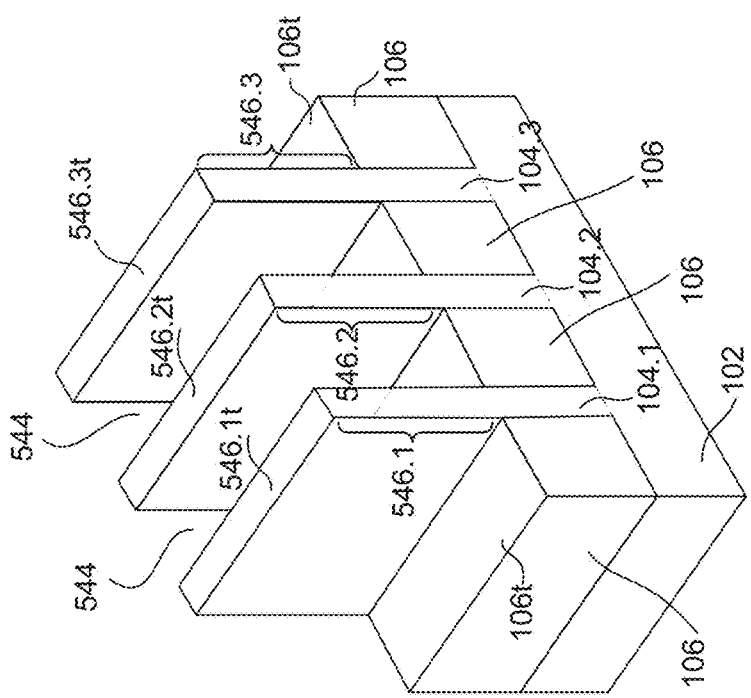

FIG. 5 is an isometric view of a partially fabricated finFET 100 after the exemplary formation of STI regions 106. The formation of STI regions 106 involves deposition and etching of a dielectric material. Trenches 442 are filled with a dielectric material. The dielectric material may include silicon oxide. In some embodiments, other dielectric materials, such as silicon nitride, silicon oxynitride, fluoride-doped silicate glass (FSG), or a low-k dielectric material, may also be used. In some embodiments, the dielectric material may be formed using a flowable CVD (FCVD) process, a high-density-plasma (HDP) CVD process, using silane ($SiH_4$) and oxygen ($O_2$) as reacting precursors. In some embodiments, the dielectric material may be formed using a sub-atmospheric CVD (SACVD) process or high aspect-ratio process (HARP), where process gases may include tetraethoxysilane (TEOS) and/or ozone ($O_3$). In some embodiments, the dielectric material may be formed using a spin-on-dielectric (SOD) such as hydrogen silsesquioxane (HSQ) or methyl silsesquioxane (MSQ).

A chemical mechanical polish or a wet etch process is then performed for the removal of hardmask layer 336b and pad layer 336a. This removal is followed by an etching of the dielectric material to form STI regions 106 and recessed regions 544 as shown in FIG. 5. Etching of the dielectric material may be performed using a wet etching process, for example, by dipping substrate 102 in hydrofluoric acid (HF). Alternatively, the etching operation may be performed using a dry etching process, for example, using $CHF_3$ or $BF_3$ as etching gases. Upper fin portions 546.1 through 546.3 of fins 104.1 through 104.3, respectively, protruding over flat top surfaces 106t of STI regions 106 are used to form channel regions of finFET 100. Upper fin portions 546.1 through 546.3 may include top surfaces 546.1t through 546.3t, respectively. In some embodiments, flat top surfaces 106t of STI regions 106 are lower than top surfaces 546.1t through 546.3t. In some embodiments, a vertical dimension of each of the upper fin portions 546.1 through 546.3 ranges from about 15 nm to about 50 nm. In some embodiments, a vertical dimension of each of the upper fin portions 546.1 through 546.3 ranges from about 20 nm to about 40 nm. In some embodiments, a vertical dimension of each of the upper fin portions 546.1 through 546.3 ranges from about 25 nm to about 35 nm.

Figure 6:
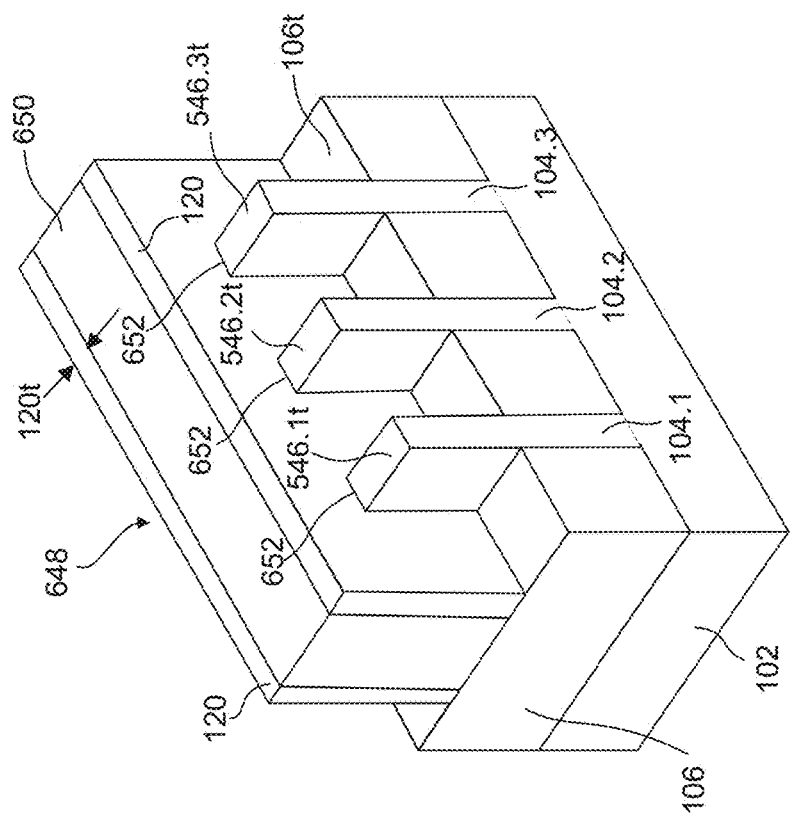

FIG. 6 is an isometric view of a partially fabricated finFET 100 after the exemplary formation of a structure 648 on fins 104.1 through 104.3 and STI regions 106. Structure 648 includes a patterned polysilicon structure 650 and spacers 120. Patterned polysilicon structure 650 and spacers 120 are formed over top surfaces 106t of STI regions 106 and over top surfaces 546.1t through 546.3t to wrap around upper fin portions 546.1 through 546.3. Interfaces 652 are formed between upper fin portions 546.1 through 546.3 and patterned polysilicon structure 650 and spacers 120. Patterned polysilicon structure 650 is formed by any suitable process. For example, patterned polysilicon structure 650 can be formed by a process including deposition, photolithography, and etching. Deposition processes include CVD, PVD, ALD, other suitable methods, and/or combinations thereof. Photolithography includes photoresist coating (e.g., spin-on coating), soft baking, mask aligning, exposure, post-exposure baking, developing the photoresist, rinsing, drying (e.g., hard baking), other suitable processes, and/or combinations thereof. Etching processes include dry etching, wet etching, and/or other etching methods (e.g., reactive ion etching). Spacers 120 may include dielectric material such as silicon oxide, silicon carbide, silicon nitride, silicon oxy-nitride, or other suitable material. Spacers 120 may include a single layer or multilayer structure. A blanket layer of a dielectric material may be formed over patterned polysilicon structure 650 by CVD, PVD, ALD, or other suitable technique followed by an anisotropic etching of the dielectric material to form spacers 120 on two sides of patterned polysilicon structure 650. Each of spacers 120 has a thickness 120t in a range from about 5 nm to about 15 nm.

Figure 7:
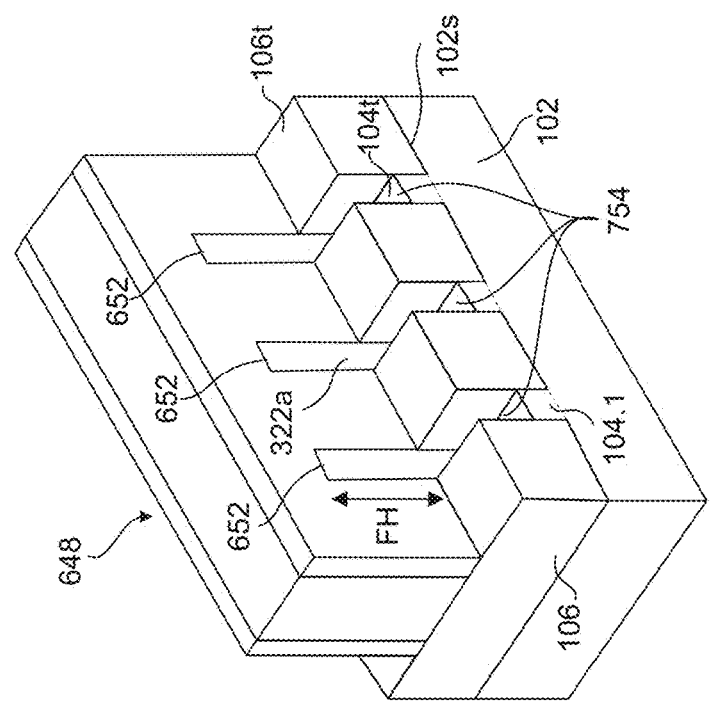

FIG. 7 is an isometric view of a partially fabricated finFET 100 after the exemplary formation of recessed fin portions 754 of fins 104.1 through 104.3. The portions of fins 104.1 through 104.3 that are not covered by structure 648 are recessed to form recessed fin portions 754 of fins 104.1 through 104.3 having surfaces 104t. In some embodiments, surfaces 104t of recessed fin portions 754 are below the flat top surfaces 106t of STI regions 106. In alternative embodiments, the portions of fins 104.1 through 104.3 that are not covered by structure 648 are recessed to expose top surface 102s of substrate 102. In some embodiments, using spacers 120 as masks, a biased etching process is performed to form recessed fin portions 754. The etching process may be performed under a pressure of about 1 mTorr to about 1000 mTorr, a power of about 50 W to about 1000 W, a bias voltage of about 20 V to about 500 V, at a temperature of about 40° C. to about 60° C., and using a HBr and/or $Cl_2$ as etch gases. Also, the bias voltage used in the etching process may be tuned to allow better control of an etching direction to achieve desired profiles for recessed fin portions 754.

Figure 8:
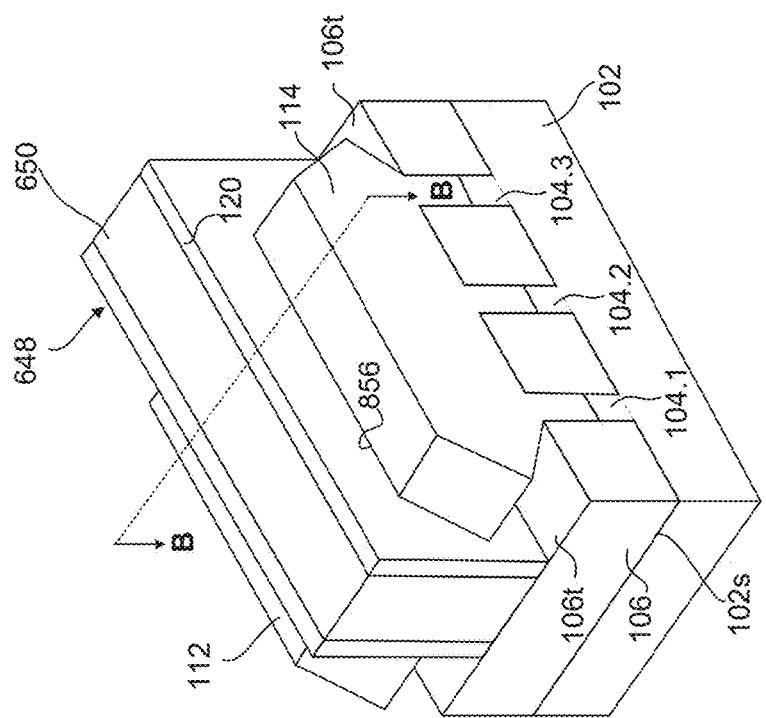

FIG. 8 is an isometric view of a partially fabricated finFET 100 after the exemplary formation of source/drain regions 112 and 114 on recessed fin portions 754 of fins 104.1 through 104.3. Source/drain regions 112 and 114 include epitaxially-grown semiconductor material on recessed portions 754 of fins 104.1 through 104.3. Semiconductor material of source/drain regions 112 and 114 is selectively epitaxially-grown over recessed portions 754. In some embodiments, the selective epitaxial growth of the semiconductor material of source/drain regions 112 and 114 continues until the semiconductor material extends vertically a distance in a range from about 10 nm to about 100 nm above top surface 102s of substrate 102 and extends laterally over top surfaces 106t of some of STI regions 106. The semiconductor material includes element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial processes for growing the semiconductor material may include CVD deposition techniques (e.g., LPCVD, vapor-phase epitaxy (VPE) and/or ultra-high vacuum CVD (UHV-CVD)), molecular beam epitaxy, and/or other suitable processes. In some embodiments, the semiconductor material, such as silicon carbon (SiC), is epi-grown by a LPCVD process to form the source/drain regions 112 and 114 of an n-type finFET 100. The LPCVD process is performed at a temperature of about 400 to about 800° C. and under a pressure of about 1 Torr to about 200 Torr, using $Si_3H_8$ and $SiH_3CH$ as reaction gases. In some embodiments, the semiconductor material, such as silicon germanium (SiGe), is epi-grown by a LPCVD process to form source/drain regions 112 and 114 of a p-type finFET 100. The LPCVD process is performed at a temperature of about 400° C. to about 800° C. and under a pressure of about 1 Torr to about 200 Torr, using $SiH_4$ and $GeH_4$ as reaction gases.

Source/drain regions 112 and 114 may be in-situ doped during the epitaxial growth of the semiconductor material. In some embodiments, the epitaxially grown source/drain regions 112 and 114 may be doped with p-type dopants, such as boron or $BF_2$; n-type dopants, such as phosphorus or arsenic; and/or combinations thereof; epitaxially grown SiGe source/drain regions 112 and 114 may be doped with p-type dopants, such as boron or $BF_2$, n-type dopants, such as phosphorus or arsenic, and/or combinations thereof; epitaxially grown Si source/drain regions 112 and 114 may be doped with carbon to form Si:C source/drain features, phosphorous to form Si:P source/drain features, or both carbon and phosphorous to form SiCP source/drain features. In some embodiments, source/drain regions 112 and 114 are not in-situ doped, an ion implantation process is performed to dope source/drain regions 112 and 114. One or more annealing processes may be performed to activate source/drain regions 112 and 114. Annealing processes include but are not limited to rapid thermal annealing (RTA) and/or laser annealing processes.

Further illustrated in FIG. 8 are interfaces 856 between spacers 120 and source/drain regions 112 and 114. In some embodiments, interfaces 856 are coplanar with interfaces 652 (shown in FIG. 6). In some embodiments, interfaces 856 are either above or below interfaces 652.

FIG. 9 is a cross-sectional view of the structure of FIG. 8 along line B-B after exemplary formation of an etch stop layer 958 and a first interlayer dielectric (ILD) layer 960. Etch stop layer 958 is formed on sides of spacers 120 and on top of source/drain regions 112 and 114. Etch stop layer 958 may be used as a mask layer and a protective layer to protect source/drain regions 112 and 114 during formation of source/drain contact structures (not shown). In some embodiments, etch stop layer 958 is formed of materials including, but not limited to, SiNx, SiOx, SiON, SiC, SiCN, BN, SiBN, SiCBN, and combinations thereof. Etch stop layer 958 may be formed using plasma enhanced chemical vapor deposition (PECVD), sub atmospheric chemical vapor deposition (SACVD), low pressure chemical vapor deposition (LPCVD), ALD, high-density plasma (HDP), plasma enhanced atomic layer deposition (PEALD), molecular layer deposition (MLD), plasma impulse chemical vapor deposition (PICVD), or other suitable deposition methods. In some embodiments, etch stop layer 958 includes a silicon nitride or a silicon oxide formed by LPCVD, PECVD, or CVD, or a silicon oxide formed by HARP. In some embodiments, etch stop layer 958 has a thickness in a range of about 20 nm to 200 nm. In some embodiments, etch stop layer 958 has a thickness 958*t* in a range of about 20 nm to about 100 nm.

Further illustrated in FIG. 9, ILD layer 960 is formed on etch stop layer 958. Formation of ILD layer 960 may include deposition of a dielectric material, followed by an annealing of the deposited dielectric material and planarization of the annealed dielectric material. The dielectric material of ILD layer 960 may be deposited using any deposition methods suitable for flowable dielectric materials (e.g., flowable silicon oxide, flowable silicon nitride, flowable silicon oxynitride, flowable silicon carbide, or flowable silicon oxycarbide). For example, flowable silicon oxide may be deposited for ILD layer 960 using FCVD process. A wet anneal process may performed on the deposited dielectric material of ILD layer 960. An illustrative wet anneal process includes annealing ILD layer 960 in steam at a temperature in a range from about 200° C. to about 700° C. for a period in a range from about 30 minutes to about 120 minutes. In some embodiments, the dielectric material is silicon oxide. The wet annealed dielectric material of ILD layer 960 may then be planarized by chemical mechanical polishing (CMP). CMP of the wet annealed dielectric material forms ILD layer 960 having top surface 960*a* which is coplanar with top surface 650*a* of patterned polysilicon structure 650. During the CMP process, a portion of etch stop layer 958 above structure 648 is removed.

FIGS. 10-14 show various stages of an exemplary gate replacement process for finFET 100 to replace structure 648 with gate structure 108.

FIG. 10 is a cross-sectional view of the exemplary structure of FIG. 9 after removal of patterned polysilicon structure 650 followed by deposition of dielectric layer 116. Patterned polysilicon structure 650 may be removed by a dry etching process such as reactive ion etching (RIE). The gas etchants used in etching of polysilicon 650 may include chlorine, fluorine, bromine, and/or combinations thereof. Dielectric layer 116 is disposed on top surfaces 106*t* of STI regions 106 and is wrapped around upper fin portions 546.1 through 546.3 (not shown). Dielectric layer 116 is also disposed along sidewalls 1062*a* and bottom surface 1062*b* of trench 1062 formed after removal of patterned polysilicon structure 650. Dielectric layer 116 may include one or more layers of silicon oxide, silicon nitride, silicon oxy-nitride, or high-k dielectric materials such as hafnium oxide ($HfO_2$), $TiO_2$, HfZrO, $Ta_2O_5$, $HfSiO_4$, $ZrO_2$, $ZrSiO_2$, or combinations thereof. Dielectric layer 116 may be formed by CVD, ALD, PVD, e-beam evaporation, or other suitable process. Alternatively, high-k dielectric materials may include metal oxides. Examples of metal oxides used for high-k dielectrics include oxides of Li, Be, Mg, Ca, Sr, Sc, Y, Zr, Al, La, Ce, Pr, Nd, Sm, Eu, Gd, Tb, Dy, Ho, Er, Tm, Yb, Lu, and/or mixtures thereof. The high-k dielectric layer may be formed by ALD and/or other suitable methods.

FIG. 11 is a cross-sectional view of the structure of FIG. 10 after exemplary deposition of gate work function metal layer 222. Gate work function metal layer 222 is disposed on dielectric layer 116. In some embodiments, gate work function metal layer 222 includes any suitable material, such as Al, Cu, W, Ti, Ta, TiN, TaN, NiSi, CoSi, Ag, TaC, TaSiN, TaCN, TiAl, TiAlN, WN, metal alloys, and/or combinations thereof. The one or more materials included in gate work function metal layer 222 may be formed using a suitable process such as ALD, CVD, PVD, plating, or combinations thereof. In some embodiments, the deposited gate work function metal layer 222 has a thickness 222*t* in the range of about 2 nm to about 15 nm.

FIG. 12 is a cross-sectional view of the structure of FIG. 11 after exemplary deposition of gate metal liner 228. Gate metal liner 228 is disposed on gate work function metal layer 222. Gate metal liner 228 may serve as a nucleation layer, which acts as a growth site for subsequent deposition of gate metal fill layer 224. Gate metal liner 228 may include any suitable metal such as W, Al, Co, Ti, Ag, Al, Mn, Zr, Cu, Ni, and/or combinations thereof and may be formed by ALD, PVD, CVD, or other suitable metal deposition process. In some embodiments, gate metal liner 228 includes W formed by ALD or CVD using a non-fluorine based precursor (e.g., WCl$_5$, WCl$_6$). In some embodiments, gate metal liner 228 includes silane (SiH$_4$) reduced W.

The metal precursor for the deposition of gate metal liner 228 may be provided to a deposition chamber in a gaseous form. In some embodiments, during the deposition of gate metal liner 228, the deposition chamber is maintained at a pressure in a range from about 1 Torr to about 100 Torr and substrate 102 or the deposition chamber is maintained at temperature in a range from about 200° C. to 600° C. In some embodiments, during the deposition of gate metal liner 228, the metal precursor is flowed for a period of time in a range from about 1 minute to about 20 minutes and the deposition rate of gate metal liner 228 is in a range from about 0.001 nm/sec to about 0.1 nm/sec.

Figure 13:
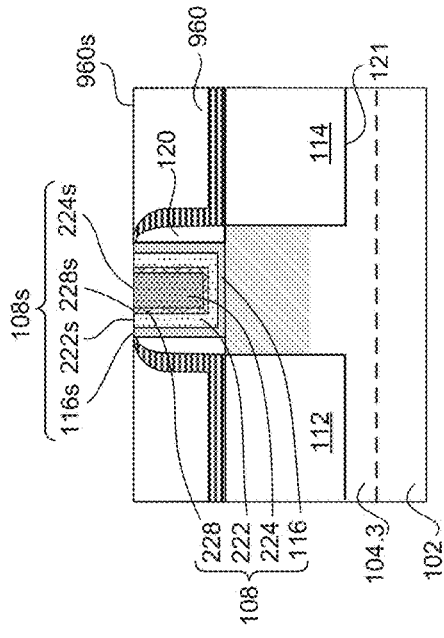

FIG. 13 is a cross-sectional view of the structure of FIG. 12 after exemplary deposition of gate metal fill layer 224. Gate metal fill layer 224 is disposed on gate metal liner 228. Gate metal fill layer 224 may include a single metal layer or a stack of metal layers. The stack of metal layers may include metals that are different from each other. In some embodiments, gate metal fill layer 224 includes any suitable conductive material, such as Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. Gate metal fill layer 224 may be formed by ALD, PVD, CVD, or other suitable conductive material deposition process. In some embodiments, gate metal fill layer 224 includes substantially fluorine-free (FF) metal film or FF metal-containing film formed by ALD or CVD using one or more non-fluorine based metal precursors. The substantially FF metal film or FF metal-containing film may include an amount of fluorine contaminants less than 5 atomic percent in the form of ions and/or atoms. The fluorine contaminants may be from other process variables and not from the deposition process of the substantially FF metal film or FF metal-containing film. In some embodiments, the substantially FF metal film or FF metal-containing film may include an amount of non-fluorine contaminants or non-fluorine halogen contaminants greater than 3 atomic percent (e.g., about 5 atomic percent, about 7 atomic percent, about 10 atomic percent) in the form of ions and/or atoms. In some embodiments, gate metal fill layer 224 includes substantially fluorine-free tungsten (FFW) film or FFW-containing film having an amount of fluorine contaminants less than 5 atomic percent and an amount of chlorine contaminants greater than 3 atomic percent (e.g., about 5 atomic percent, about 7 atomic percent, about 10 atomic percent). The substantially FFW film or the substantially FFW-containing film may be formed by ALD or CVD using one or more non-fluorine based W precursors such as, but not limited to, tungsten pentachloride (WCl$_5$), tungsten hexachloride (WCl$_6$).

The one or more non-fluorine based metal precursors for the deposition of gate metal fill layer 224 may be provided to the deposition chamber in a gaseous form. However, in some embodiments, unlike fluorine based metal precursors, non-fluorine based metal precursors (e.g., WCl$_5$) may be in solid form (e.g., in powder form) at room temperature. Such solid non-fluorine based precursors may be subjected to a sublimation process to change them from their solid form to their gaseous form prior to being supplied to the deposition chamber. In some embodiments, the sublimation process may include placing the one or more solid non-fluorine based metal precursors in a glass vessel (e.g., ampule) and heating the glass vessel at a temperature ranging from about 50° C. to about 80° C. In some embodiments, the glass vessel may be heated by placing a heating coil around it.

In some embodiments, the process conditions for the deposition of gate metal fill layer 224 using non-fluorine based metal precursors may be optimized to achieve a physical property (e.g., crystal structure, crystal orientation, and/or resistivity) of gate metal fill layer 224 that may be similar to the physical property of gate metal fill layers deposited using fluorine based metal precursors. For example, in some embodiments, gate metal fill layer 224 may be deposited using precursor WCl$_5$ at a deposition temperature ranging from about 400° C. to 500° C. and at a deposition pressure below 5 torr (e.g., 4 torr, 3 torr, or 2 torr) to achieve a physical property similar to gate metal fill layer deposited using precursor WF$_6$. The deposition temperature may be the temperature of substrate 102 maintained during the deposition process. The deposition pressure may be the pressure in the deposition chamber maintained during the deposition process.

The non-fluorine based metal deposition process may have a higher deposition temperature and a lower deposition pressure than the respective temperature and pressure of fluorine based metal deposition process due to a slower deposition rate in the non-fluorine based metal deposition process compared to the deposition rate in the fluorine based metal deposition process. In some embodiments, a deposition rate of gate metal fill layer 224 using a non-fluorine based metal precursor may range from about 0.01 nm/sec to about 0.1 nm/sec, while a deposition rate of a gate metal fill layer using a fluorine based metal precursor may range from about 0.1 nm/sec to about 0.5 nm/sec.

In some embodiments, gate metal fill layer 224 may be deposited using a gas mixture having WCl$_5$ gas, argon, and hydrogen. The flow rate of the gas mixture may range from about 20 sccm to about 500 sccm. The ratio of WCl$_5$ gas to argon to hydrogen may range from about 1:1:35 to about 1:3:45. In some embodiments, the gas mixture may be flowed for a period of time ranging from about 10 minutes to about 50 minutes to deposit gate metal fill layer 224.

In some embodiments, gate metal fill layer 224 and gate metal liner 228 are deposited in-situ using ALD or CVD, that is without breaking a vacuum between the depositions of layer 224 and liner 228. In some embodiments, gate metal fill layer 224 is deposited after partial or complete oxidation of gate metal liner 228 by breaking the vacuum in the deposition chamber after deposition of gate metal liner 228, and exposing gate metal liner 228 to air for a period that ranges from about 1 minute to about 5 minutes. The oxidized portions of gate metal liner 228 (not shown) may help to prevent and/or reduce the diffusion of unwanted and/or detrimental elements from gate metal fill layer 224 into one or more underlying layers and/or structures such as gate work function metal layer 222, dielectric layer 116, fins 104.1 through 104.3, and/or source/drain regions 112 and 114 during subsequent processing of finFET 100.

Gate metal fill layers in gate electrodes of current devices can include a W film or W-containing film that is made using one or more fluorine-based W precursors (e.g., tungsten hexafluoride (WF$_6$)). The gate metal fill layers in gate electrodes of current devices can have an amount of fluorine contaminants greater than 10 atomic percent (e.g., 15 atomic percent, 20 atomic percent). The current devices generally suffer from poor device performance due to diffusion of fluorine from the W film or the W-containing film into one or more underlying layers such as gate work function metal layers (e.g., gate work function metal layer 222), dielectric layers (e.g., dielectric layer 116), fins (e.g., fins 104.1 through 104.3), and/or other layers and/or structures of the current devices. The presence of such fluorine contaminants greater than 5 atomic percent fluorine in the W film or the W-containing film, adversely affects the chemical and physical properties of the materials of the underlying layers of the current devices. For example, diffusion of fluorine contaminants into underlying gate work function metal layers can negatively affect the work function of the one or more metals included in the gate work function metal layers of current devices, and consequently, have negative effect on their threshold voltage.

Threshold voltage non-uniformity in the current devices is another negative effect of fluorine diffusion from the W film or the W-containing film into the underlying layers and/or structures of the current devices. Threshold voltage non-uniformity can result in poor control of current/voltage operation, poor load balancing at turn-on, and consequently, poor performance of the current devices. This non-uniformity in threshold voltage is due to non-uniform diffusion of fluorine from the W film or the W-containing film into the one or more underlying layers and/or structures. The amount of fluorine diffused into a portion of the underlying layer and/or structure may depend on a thickness of a portion of gate metal fill layer disposed over the portion of the underlying layer and/or structure. Different portions of gate metal fill layer having different thicknesses may have different amounts of fluorine contaminants. Thus, different amounts of fluorine contaminants may diffuse into different portions of the underlying layers and/or substrate. The different thicknesses of the different portions of gate metal fill layer may be a design choice for achieving a predetermined device performance and/or may be due to limitations in, for example, photolithographic process, etching process, other device fabrication processes, or a combination thereof.

The substantially FF gate metal fill layer 224 helps to overcome the fluorine contamination problems of current devices. In some embodiments, threshold voltage non-uniformity is reduced by about 20% in devices (e.g., finFET 100) having FF gate metal fill layers (e.g., gate metal fill layer 224) compared to threshold voltage non-uniformity in devices (e.g., finFET 100*) having fluorine-contaminated W film or W-containing film that is made using one or more fluorine-based W precursors.

Figure 14:
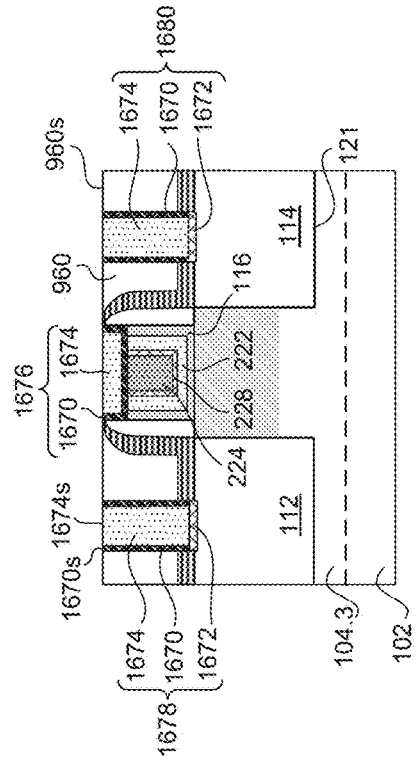

FIG. 14 is a cross-sectional view of the structure of FIG. 13 after exemplary planarization of gate metal fill layer 224, gate metal liner 228, gate work function metal layer 222, and dielectric layer 116. Gate metal fill layer 224, gate metal liner 228, gate work function metal layer 222, and dielectric layer 116 may be planarized using a CMP process. In some embodiments, ILD layer 960 acts as a planarization stop layer during planarizing of these layers. CMP removes excess portions of gate metal fill layer 224, gate metal liner 228, gate work function metal layer 222, and dielectric layer 116, such that top surfaces 224s, 228s, 222s, and 116s of gate metal fill layer 224, gate metal liner 228, gate work function metal layer 222, and dielectric layer 116, respectively, are coplanar with top surface 960s of ILD layer 960. It should be noted that even though gate metal liner 228 is shown in gate replacement process of FIGS. 13-14, a person skilled in the art(s) would understand that gate metal liner 228 may not be present at these stages of the gate replacement process if gate metal liner 228 is completely oxidized during the optional oxidation process of gate metal liner 228 discussed above.

Figure 15:
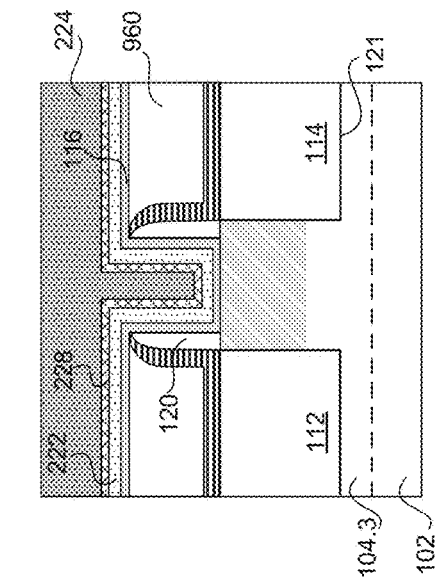
Figure 16:
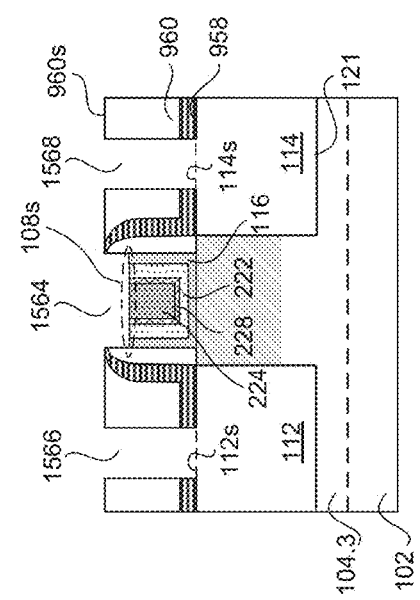

FIGS. 15-16 show various stages of an exemplary process for formation of gate contact structure 1676 and source/drain contact structures 1678 and 1680 of finFET 100.

FIG. 15 is a cross-sectional view of the structure of FIG. 14 after exemplary formation of gate contact opening 1564 and source/drain contact openings 1566 and 1568. Gate contact opening 1564 is formed by etching back top surface 108s of gate structure 108 such that top surface 108s is below top surface 960s of ILD layer 960. It should be noted that even though FIG. 15 shows top surfaces 224s, 228s, 222s, and 116s included in top surface 108s of gate structure 108 to be coplanar with each other, top surfaces 224s, 228s, 222s, and 116s can be below top surface 960s and be non-coplanar with each other without departing from the spirit and scope of the present disclosure. Gate contact opening 1564 may be formed by photolithographic patterning and etching. A photoresist may be patterned on top surface of the structure of FIG. 14 such that a portion of top surface 108s is exposed that is to be etched to form gate contact opening 1564. The top surface 108s etch back process may include one or more dry etching, wet etching, and/or plasma etching processes to remove the exposed portion of top surface 108s.

In some embodiments, source/drain contact openings 1566 and 1568 may be formed before or after gate contact opening 1564. Source/drain contact openings 1566 and 1568 are formed through ILD layer 960 and etch stop layer 958 at locations above source/drain regions 112 and 114, respectively. The formation of source/drain contact openings 1566 and 1568 includes forming a layer of photoresist (not shown) over ILD layer 960 by a suitable process, such as spin-on coating, patterning the layer of photoresist to form a patterned photoresist feature by a lithography method, and etching the exposed portions of ILD layer 960 for example, by using a dry etching, wet etching, and/or plasma etching process. This etching process removes the exposed portions of ILD layer 960 and corresponding portions of etch stop layer 958 over source/drain regions 112 and 114 to expose top surface portions 112s and 114s of respective source/drain regions 112 and 114. The patterned photoresist layer may be stripped thereafter. It should be noted that cross-sectional shapes of contact openings 1564, 1566, and 1568 shown in FIG. 15 are for illustrative purposes, and are not limiting. Contact openings 1564, 1566, and 1568 may have other cross-sectional shapes.

FIG. 16 is a cross-sectional view of the structure of FIG. 15 after exemplary formation of gate contact structure 1676 and source/drain contact structures 1678 and 1680. Gate contact structure 1676 and source/drain contact structures 1678 and 1680 are configured to provide signals to gate structure 108 and source/drain regions 112 and 114, respectively. Each of gate contact structure 1676 and source/drain contact structures 1678 and 1680 includes a diffusion barrier layer 1670 and a conductive layer 1674. Each of source/drain contact structures 1678 and 1680 further includes a silicide layer 1672.

In some embodiments, diffusion barriers 1670 include a single layer or a stack of conductive materials such as, but not limited to, TiN, Ti, or Ni. In some embodiments, conductive layers 1674 include conductive material such as W, Al, Co, or Cu. In some embodiments, conductive layers 1674 include substantially FF conductive material (e.g., FFW, FF cobalt (FFCo)) formed using one or more non-fluorine based precursors. The substantially FF conductive material may include an amount of fluorine contaminants less than 5 atomic percent in the form of ions and/or atoms. The fluorine contaminants may be from other process variables (e.g., etching process) and not from the deposition process of the substantially conductive material. In some embodiments, the substantially conductive material may include an amount of non-fluorine contaminants or non-fluorine halogen contaminants (e.g., chlorine contaminants)

greater than 3 atomic percent (e.g., about 5 atomic percent, about 7 atomic percent, about 10 atomic percent) in the form of ions and/or atoms. Silicide layers 1672 may include metal silicides and may provide a low resistance interface between each conductive layer 1674 and corresponding source/drain regions 112 and 114. Examples of metal used for forming metal silicides are Co, Ti, or Ni.

Conductive material in source/drain contact structures of current devices can include W material that is made using one or more fluorine-based W precursors (e.g., tungsten hexafluoride ($WF_6$)). The W material in the source/drain contact structures of current devices can have an amount of fluorine contaminants greater than 10 atomic percent (e.g., 15 atomic percent, 20 atomic percent). These fluorine contaminants tend to diffuse into silicide layers and diffusion barrier layers in source/drain contact structures of current devices. Such fluorine diffusion increases the resistivity of diffusion barrier layers and silicide layers, and consequently, increases the contact resistance of the source/drain contact structures of current devices. This increase in contact resistance in turn results in an adverse impact on device yield due to, for example, contact failures, device operation failures, thermal failures from high contact resistance. The substantially FF conductive material of conductive layers 1674 helps to overcome such fluorine contamination problems in source/drain contact structures of current devices and improve their performance.

Contact structures 1676, 1678, and 1680 are formed simultaneously. Formation of contact structures 1676, 1678, and 1680 may include a deposition process to deposit diffusion barrier layers 1670, followed by a thermal process to anneal deposited diffusion barrier layers 1670 to form silicide layers 1672, a deposition process to deposit conductive layers 1674, and a planarization process or an etch back process to coplanarize top surfaces 1670s and 1674s of respective diffusion barrier layers 1670 and conductive layers 1674 with top surface 960s of ILD layer 960. In some embodiments, TiN, Ti, Ni, Co, or a combination thereof is deposited by ALD or CVD to form diffusion barrier layers 1670 along sidewalls of gate contact opening 1564 and source/drain contact openings 1566 and 1568, top surface portions 112s and 114s (not shown) and on top surface 960s (not shown). This deposition of diffusion barrier layers 1670 is followed by a rapid thermal annealing process at a temperature in a range from about 700° C. to about 900° C. to form silicide layers 1672. Deposition of the substantially FF conductive material of conductive layers 1674 is performed by CVD, PVD, ALD, or other suitable technique using one or more non-fluorine based precursors such as, but not limited to, tungsten pentachloride ($WCl_5$), tungsten hexachloride ($WCl_6$). The substantially FF conductive material is deposited until gate contact opening 1564 and source/drain contact openings 1566 and 1568 are filled or overfilled. Then, a CMP process is performed to coplanarize top surfaces 1670s and 1674s of respective diffusion barrier layers 1670 and conductive layers 1674 with top surface 960s of ILD layer 960.

FIGS. 17-18 show various stages of another exemplary process for formation of gate contact structure 1676 and source/drain contact structures 1678 and 1680 of finFET 100.

FIG. 17 is a cross-sectional view of the structure of FIG. 14 after formation of gate contact opening 1764 and source/drain contact openings 1766 and 1768, according to some embodiments. Contact openings 1764, 1766, and 1768 are formed after deposition of a second ILD layer 1782 on the structure of FIG. 14 such that ILD layer 1782 is disposed on top surface 960s of ILD layer 960 and top surface 108s of gate structure 108.

In some embodiments, gate contact opening 1764 may be formed before or after source/drain contact openings 1766 and 1768. The formation of gate contact opening 1764 includes forming a layer of photoresist (not shown) on ILD layer 1782 by a suitable process, such as spin-on coating, patterning the layer of photoresist to form an exposed portion on ILD 1782 corresponding to top surface 108s, by a lithography process, and etching the exposed portion of ILD layer 1782 for example, by using a dry etching, wet etching, and/or plasma etching process. This etching process removes the exposed portion of ILD layer 1782 to expose a portion of top surface 108s. In some embodiments, the etching process removes the exposed portion of ILD layer 1782 to expose top surface 108s completely (not shown). The patterned photoresist layer may be stripped thereafter.

Source/drain contact openings 1766 and 1768 are formed through ILD layers 1782 and 960 and etch stop layer 958 at locations above source/drain regions 112 and 114, respectively. The formation of source/drain contact openings 1766 and 1768 is similar to the formation of source/drain contact openings 1566 and 1568 except the photoresist layer is formed and patterned over ILD layer 1782 and exposed portions of ILD layer 1782 are etched in addition to exposed portions of ILD layer 960 and corresponding portions of etch stop layer 958 over source/drain regions 112 and 114 as discussed with reference to FIG. 15. It should be noted that cross-sectional shapes of contact openings 1764, 1766, and 1768 shown in FIG. 17 are for illustrative purposes, and are not limiting. Contact openings 1764, 1766, and 1768 may have other cross-sectional shapes.

FIG. 18 is a cross-sectional view of the structure of FIG. 15 after exemplary formation of gate contact structure 1876 and source/drain contact structures 1878 and 1880. Contact structures 1876, 1878, and 1880 are similar to contact structures 1676, 1678, and 1680, respectively, in functionality. Each of gate contact structure 1876 and source/drain contact structures 1878 and 1880 includes diffusion barrier layer 1870 and conductive layer 1874. Each of source/drain contact structures 1878 and 1880 further includes a silicide layer 1872.

Diffusion barrier layers 1870, conductive layers 1874, and silicide layers 1872 may be similar to diffusion barrier layers 1670, conductive layers 1674, and silicide layers 1672, respectively, with respect to material composition. Contact structures 1876, 1878, and 1880 are formed simultaneously. In some embodiments, TiN, Ti, Ni, Co, or a combination thereof is deposited by ALD or CVD to form diffusion barrier layers 1870 along sidewalls of gate contact opening 1764 and source/drain contact openings 1766 and 1768, top surface portions 112s and 114s (not shown) and on top surface 1782s (not shown). This deposition of diffusion barrier layers 1870 is followed by a rapid thermal annealing process at a temperature in a range from about 700° C. to about 900° C. to form silicide layers 1872. Deposition of substantially FF conductive material of conductive layers 1874 is performed by CVD, PVD, ALD, or other suitable technique using one or more non-fluorine based precursors such as, but not limited to, tungsten pentachloride ($WCl_5$), tungsten hexachloride ($WCl_6$). The substantially FF conductive material is deposited until gate contact opening 1764 and source/drain contact openings 1766 and 1768 are filled or over-filled. Then, a CMP process is performed to coplanarize top surfaces 1870s and 1874s of respective diffusion barrier layers 1870 and conductive layers 1874 with top surface 1782s of ILD layer 1782.

Formation of contacts structures 1676, 1678, and 1680 shown in FIG. 16 or contacts structures 1876, 1878, and 1880 shown in FIG. 18 may be followed by formation of other structures such as vias, interconnect metal layers, dielectric layers, passivation layers, etc., that, for the sake of clarity, are not shown.

Example Operations for Fabricating a FinFET

Figure 19:
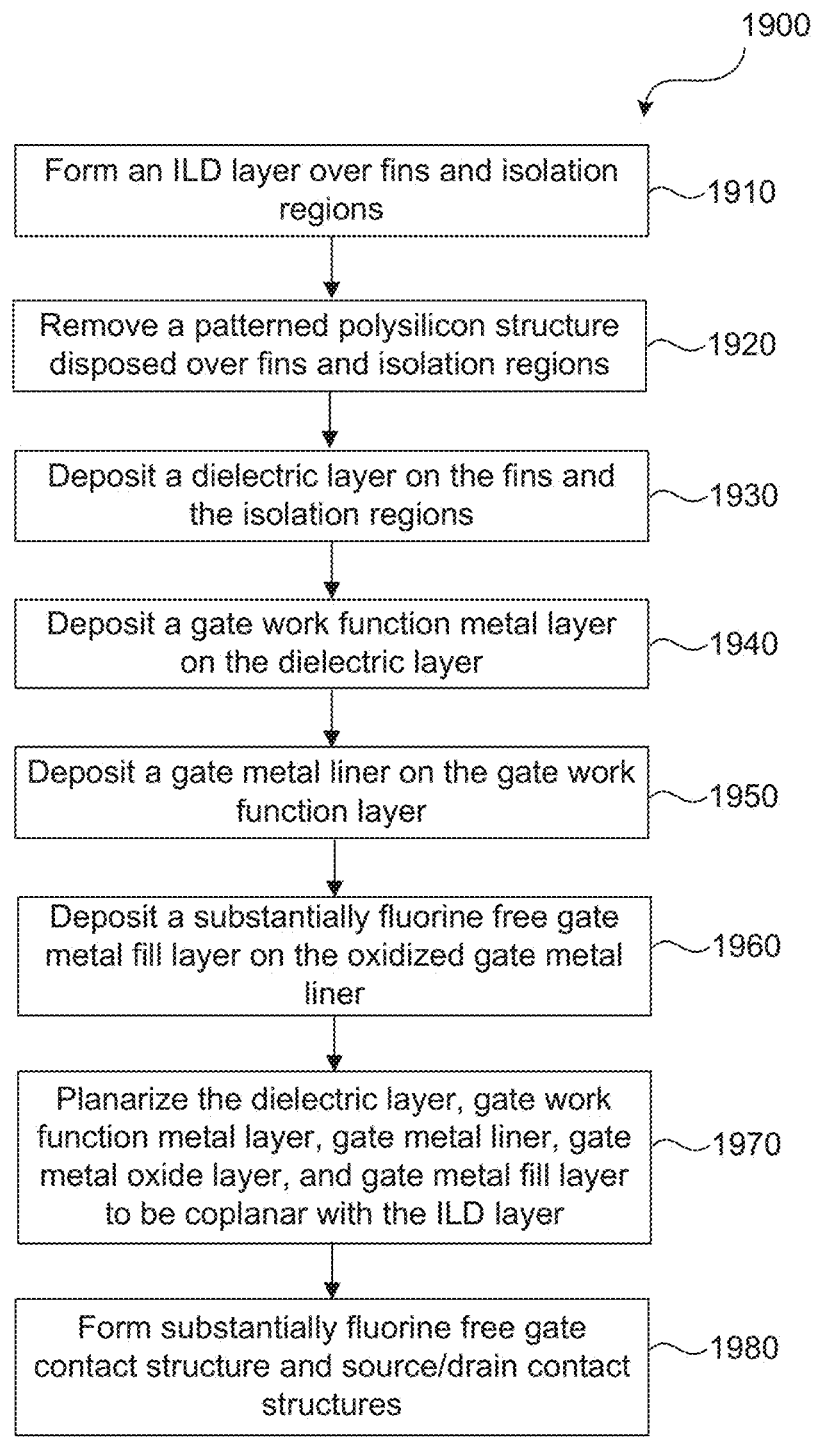
FIG. 19 is a flow diagram of a method for fabricating a finFET, according to some embodiments.

FIG. 19 is a flow diagram of an exemplary method 1900 for fabricating finFET 100. For illustrative purposes, the operations illustrated in FIG. 19 will be described with reference to the example fabrication process illustrated in FIGS. 3-18. Operations can be performed in a different order or not performed depending on specific applications. It should be noted that method 1900 does not produce a completed finFET 100. Accordingly, it is understood that additional processes may be provided before, during, and after method 1900, and that some other processes may only be briefly described herein.

In operation 1910, an ILD layer is formed over fins and isolation regions. For example, an ILD layer such as ILD layer 960 is formed on fins 104.1 through 104.3 and STI regions 106. Formation of ILD layer 960 may include deposition of a dielectric material, followed by an annealing of the deposited dielectric material and planarization of the annealed dielectric material. The dielectric material of ILD layer 960 may be deposited using any deposition methods suitable for flowable dielectric materials. For example, flowable silicon oxide is deposited for ILD layer 960 using FCVD process. A wet anneal process is performed on the deposited dielectric material of ILD layer 960. The wet annealed dielectric material of ILD layer 960 may then be planarized by CMP.

In operation 1920, a patterned polysilicon structure is removed. For example, patterned polysilicon structure 650 is removed by a dry etching process such as reactive ion etching (RIE). In some embodiments, the gas etchants used in etching of patterned polysilicon structure 650 include chlorine, fluorine, bromine, and/or combinations thereof.

In operation 1930, a dielectric layer is deposited on the fins and the isolation regions. For example, a dielectric layer such as dielectric layer 116 is disposed along sidewalls 1062a and bottom surface 1062b of trench 1062 formed after removal of patterned polysilicon structure 650 in operation 1920. Dielectric layer 116 may be formed by CVD, ALD, PVD, e-beam evaporation, or other suitable process.

In operation 1940, a gate work function metal layer is deposited on the dielectric layer of operation 1930. For example, a gate work function metal layer such as gate work function metal layer 222 is disposed on dielectric layer 116 using a suitable process such as ALD, CVD, PVD, plating, or combinations thereof.

In operation 1950, a gate metal liner is deposited on the gate work function metal layer of operation 1940. For example, a gate metal liner such as gate metal liner 228 is disposed on gate work function metal layer 222 using a suitable process such as ALD, PVD, CVD, or other suitable metal deposition process.

In operation 1960, a substantially FF gate metal fill layer is formed on the gate metal liner of operation 1950. For example, a substantially FF gate metal fill layer such as gate metal fill layer 224 is disposed on gate metal liner 228. Gate metal fill layer 224 is formed by ALD, PVD, CVD, or other suitable conductive material deposition process using non-fluorine based metal precursors.

In operation 1970, the substantially FF gate metal fill layer, the gate metal liner, the gate work function metal layer, and the dielectric layer of operations 1960, 1950, 1940, and 1930 are planarized. For example, gate metal fill layer 224, gate metal liner 228, gate work function metal layer 222, and dielectric layer 116 may be planarized using CMP. The CMP may coplanarize top surfaces 224s, 228s, 222s, and 116s of gate metal fill layer 224, gate metal liner 228, gate work function metal layer 222, and dielectric layer 116, respectively, with top surface 960s of ILD 960.

In operation 1980, substantially FF gate contact structure and source/drain contact structures are formed. In one example, substantially FF gate contact structure 1676 and substantially FF source/drain contact structures 1678 and 1680 are formed as described with reference to FIGS. 15-16. In another example, substantially FF gate contact structure 1876 and substantially FF source/drain contact structures 1878 and 1880 are formed as described with reference to FIGS. 17-18.

Thus, the present disclosure describes a modified gate replacement process and a modified source/drain contact structure formation process for a semiconductor device. These modified processes help reduce or eliminate the adverse impact on the semiconductor device performance (e.g., non-uniform distribution of threshold voltage, high contact resistance between contact structure and source/drain regions) due to diffusion of fluorine contaminants from gate metal fill layers into underlying layers and/or structure and from conductive layers into diffusion barrier layers and silicide layers of source/drain contact structures during subsequent processing of the semiconductor device. In some embodiments, the modified gate replacement process includes forming a substantially FF gate metal fill layer on a substantially FF gate metal liner deposited on a gate work function layer. The substantially FF gate metal fill layer and gate metal liner are formed in-situ by an ALD or CVD process using one or more non-fluorine precursors. In some embodiments, reduction or elimination of fluorine contaminants in the replacement metal gate structure helps to reduce threshold voltage non-uniformity by about 20% compared to threshold voltage non-uniformity in devices having fluorine contaminated W films or W-containing films that are made using one or more fluorine based W precursors. In some embodiments, the modified source/drain contact structure formation process includes forming substantially FF source/drain contact structures on source/drain regions.

In some embodiments, a semiconductor device includes a fin over a substrate and a replacement gate structure over the fin. The replacement gate structure includes a dielectric layer disposed over the fin; a work function metal layer disposed over the dielectric layer; and a substantially fluorine free metal fill layer over the work function metal layer, where the substantially fluorine free metal fill layer includes an amount of fluorine less than about 5 atomic percent and an amount of chlorine greater than about 3 atomic percent.

In some embodiments, a semiconductor structure includes a gate structure over one or more fins that is disposed on a substrate and includes a conductive fill having a fluorine concentration that is less than about 5 atomic percent and a non-fluorine halide concentration of about 3 atomic percent, or greater. The semiconductor structure also includes source/drain regions on the one or more fins and adjacent to the gate structure; and a conductive structure on at least one of the source/drain regions.

In some embodiments, a finFET structure includes a fin disposed perpendicular to a substrate; a metal gate structure over a top and a side portion of the fin. The metal gate structure includes a dielectric stack over the top and the side portion of the fin; a work function layer over the dielectric stack; and a conductive fill having a fluorine concentration that is less than about 5 atomic percent and a non-fluorine halide concentration of about 3 atomic percent or greater. Further the finFET structure includes a source/drain region on the fin and adjacent to the metal gate structure.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a fin over a substrate; and
   a replacement gate structure over the fin comprising:
      a dielectric layer disposed over the fin;
      a work function metal layer disposed over the dielectric layer; and
      a substantially fluorine free metal fill layer over the work function metal layer,
   wherein the substantially fluorine free metal fill layer comprises an amount of fluorine less than about 5 atomic percent and an amount of chlorine greater than about 3 atomic percent.

2. The semiconductor device of claim 1, further comprising a contact structure over a source/drain region, wherein the contact structure comprises:
   a barrier layer;
   a silicide layer in contact with the barrier layer; and
   a substantially fluorine-free conductive layer over the silicide layer.

3. The semiconductor device of claim 2, wherein the substantially fluorine-free conductive layer comprises substantially fluorine free tungsten or substantially fluorine free cobalt.

4. The semiconductor device of claim 2, further comprising a first and a second inter-layer dielectric (ILD) layer, wherein the contact vertical structure is located within the first and second ILD layers.

5. The semiconductor device of claim 1, wherein the substantially fluorine-free metal fill layer comprises substantially fluorine free tungsten.

6. A semiconductor structure, comprising:
   a gate structure over one or more fins disposed on a substrate, wherein the gate structure comprises a conductive fill having a fluorine concentration that is less than about 5 atomic percent and a non-fluorine halide concentration of about 3 atomic percent or greater;
   source/drain regions on the one or more fins and adjacent to the gate structure; and
   a conductive structure on at least one of the source/drain regions.

7. The semiconductor structure of claim 6, wherein the non-fluorine halide concentration comprises a chlorine concentration.

8. The semiconductor structure of claim 6, wherein the conductive structure comprises substantially fluorine free tungsten or substantially fluorine free cobalt having a non-fluorine halide concentration of about 3 atomic percent or greater.

9. The semiconductor structure of claim 6, wherein the gate structure further comprises:
   a high-k dielectric;
   a work function layer over the high-k dielectric, wherein the high-k dielectric is interposed between a top surface of the one or more fins and the work function layer; and
   a liner layer over the work function layer, wherein the liner layer is interposed between the work function layer and the conductive fill.

10. The semiconductor structure of claim 6, further comprising an other conductive structure disposed on the gate structure, wherein the conductive fill of the gate structure is in contact with the other conductive structure.

11. The semiconductor structure of claim 10, wherein the other conductive structure comprises substantially fluorine free tungsten or substantially fluorine free cobalt having a chlorine concentration of about 3 atomic percent or greater.

12. A finFET structure, comprising:
   a fin disposed perpendicular to a substrate;
   a metal gate structure over a top and a side portion of the fin, wherein the metal gate structure comprises:
      a dielectric stack over the top and the side portion of the fin;
      a work function layer over the dielectric stack; and
      a conductive fill having a fluorine concentration that is less than about 5 atomic percent and a non-fluorine halide concentration of about 3 atomic percent or greater; and
   a source/drain region on the fin and adjacent to the metal gate structure.

13. The finFET structure of claim 12, further comprising a barrier layer disposed between the work function layer and the conductive fill.

14. The finFET structure of claim 13, wherein the first and second conductive structures comprise substantially fluorine free tungsten metal having a fluorine concentration that is less than about 5 atomic percent and a chlorine concentration of about 3 atomic percent or greater.

15. The finFET structure of claim 13, wherein the first and second conductive structures comprise substantially fluorine free cobalt metal having a fluorine concentration that is less than about 5 atomic percent and a chlorine concentration of about 3 atomic percent or greater.

16. The finFET structure of claim 12, further comprising:
   an isolation structure over the substrate, wherein the isolation structure covers a bottom side portion of the fin and wherein a portion of the metal gate structure extends over the isolation structure;
   a spacer structure disposed between a sidewall of the metal gate structure and the source/drain region;
   a first conductive structure on the source/drain region; and
   a second conductive structure on the metal gate structure.

17. The finFET structure of claim 12, wherein the conductive fill comprises substantially fluorine free tungsten.

18. The finFET structure of claim 12, wherein the non-fluorine halide comprises chlorine.

19. The finFET structure of claim 12, wherein the source/drain region comprises one or more epitaxial layers.

20. The finFET structure of claim 12, wherein the dielectric stack comprise a high-k dielectric.

* * * * *